(12) United States Patent
Yamaguchi (10) Patent No.: US 7,599,053 B2
(45) Date of Patent: Oct. 6, 2009

(54) PATTERN DEFECT INSPECTION METHOD, PHOTOMASK MANUFACTURING METHOD, AND DISPLAY DEVICE SUBSTRATE MANUFACTURING METHOD

(75) Inventor: Noboru Yamaguchi, Tokyo (JP)

(73) Assignee: Hoya Corporation, Tokyo (JP)

( * ) Notice: Subject to any disclaimer, the term of this patent is extended or adjusted under 35 U.S.C. 154(b) by 403 days.

(21) Appl. No.: 11/730,416

(22) Filed: Apr. 2, 2007

(65) Prior Publication Data

US 2007/0229814 A1 Oct. 4, 2007

(30) Foreign Application Priority Data

Mar. 31, 2006 (JP) ............................. 2006-101215

(51) Int. Cl.
G01N 21/00 (2006.01)
(52) U.S. Cl. ................................. 356/237.4; 356/237.2
(58) Field of Classification Search .... 356/237.1–237.5
See application file for complete search history.

(56) References Cited

U.S. PATENT DOCUMENTS 5,764,209 A * 6/1998 Hawthorne et al. ........... 345/87

2005/0153466 A1* 7/2005 Choi et al. .................... 438/14
2006/0105476 A1* 5/2006 Choi et al. .................... 438/14

FOREIGN PATENT DOCUMENTS

JP 9-329555 A 12/1997

* cited by examiner

*Primary Examiner*—Michael P Stafira
(74) *Attorney, Agent, or Firm*—Sughrue Mion, PLLC (57) ABSTRACT

A defect inspection method is adapted to inspect a defect generated in a main pattern of a photomask. The main pattern includes a repetitive pattern in which unit patterns are periodically arranged. The method forms, an auxiliary pattern for inspection simultaneously with forming the main pattern. The auxiliary pattern includes a repetitive pattern having a period different from that of the main pattern. The method irradiates a light onto the auxiliary pattern at a predetermined incident angle and receives diffracted light generated by the auxiliary pattern by an observation apparatus to detect a defect of the auxiliary pattern, thereby determining the presence of a defect of the main pattern.

21 Claims, 6 Drawing Sheets

PATTERN DEFECT INSPECTION METHOD, PHOTOMASK MANUFACTURING METHOD, AND DISPLAY DEVICE SUBSTRATE MANUFACTURING METHOD

This invention claims priority to prior Japanese patent application JP 2006-101215, the disclosure of which is incorporated herein by reference.

BACKGROUND OF THE INVENTION

This invention relates to a pattern defect inspection method for inspecting a defect in a repetitive pattern of an inspection object, a photomask manufacturing method for manufacturing a photomask by carrying out such a defect inspection, and a display device substrate manufacturing method for manufacturing a substrate for a display device (hereinafter also referred to as a "display device substrate") using such a photomask.

For a display device substrate as an inspection object or a photomask, as an inspection object, used for manufacturing the display device substrate, it is necessary to inspect a defect in a pattern formed on the surface thereof. This defect in the pattern includes an error such that irregularity unintentionally takes place in regularly arranged unit patterns. This may also be called an irregularity defect and is generated due to some cause in the manufacturing process or the like.

If a defect occurred in a pattern of a photomask used in the manufacture of a display device, the defect is transferred to a pattern of a substrate for the display device. If the defect exists in the display device substrate, there is a possibility that display unevenness occurs, leading to a reduction in device performance.

Even when the foregoing defect in the pattern of the display device substrate or the photomask cannot be detected in a shape inspection of individual unit patterns due to the fact that, normally, fine defects are regularly arranged, the entire region including the defects is observed to be different from other portions. Therefore, the defect inspection is mainly performed by an appearance inspection such as an oblique light inspection by visual observation.

However, since there is a problem that this visual inspection causes variation in inspection results depending on an operator, there has been a demand for automation of a defect inspection using a defect inspection apparatus.

As an apparatus that automates a visual oblique light inspection, there is, for example, a macro inspection apparatus for a substrate for a semiconductor device manufactured by a semiconductor wafer. For example, Japanese Unexamined Patent Application Publication (JP-A) No. H09-329555 discloses an apparatus comprising a light source adapted to irradiate a light with a predetermined wavelength onto a periodic structure (repetitive pattern) formed on the surface of a semiconductor wafer, a camera adapted to receive diffracted light from the surface of the wafer, and detection means for detecting a defect by comparing image data captured by the camera with defectless reference data. This macro inspection apparatus captures the entire surface of the wafer in a single field of view, thereby inspecting a surface defect in the periodic structure on the surface of the wafer caused by a focus offset, a defocus due to variation in upper and lower positions of the wafer by the presence of dust (particles) on the bottom surface of the wafer, or a developing, etching, or stripping process of the wafer.

SUMMARY OF THE INVENTION

For detecting the defect which occurred in the repetitive pattern (defect such as variation in position or line width of unit patterns forming the repetitive pattern) formed on the surface of the semiconductor wafer by using the diffracted light from the repetitive pattern, it is necessary to recognize the defect as an error of the diffracted light and to detect diffracted light including the error component in the received diffracted light. This diffracted light including the error component can be satisfactorily detected when the period of the repetitive pattern is a certain length or less, for example, 50 μm or less. Therefore, it is possible to satisfactorily detect, for example, a defect which occurred in a repetitive pattern of a semiconductor device substrate having a period of about 2 μm or less or a defect which occurred in a repetitive pattern of a semiconductor device manufacturing photomask having a period of about 15 μm or less.

On the other hand, when the period of a repetitive pattern is greater than the foregoing periods and is, for example, about 100 to 1000 μm like a photomask for use in manufacturing a substrate for a display device such as a liquid crystal display panel, it is difficult to detect a defect which occurred in the repetitive pattern (defect such as variation in position or line width of unit patterns forming the repetitive pattern) by the foregoing macro inspection using diffracted light. One of the reasons will be described in the following. When the period of the repetitive pattern increases as described above, a difference between an nth-order diffraction angle of nth-order diffracted light from the repetitive pattern and an (n+1)th-order diffraction angle of (n+1)th-order diffracted light therefrom becomes very small. As a result, the intensity of the diffracted light with no error component increases while the diffracted light with an error component representing the presence of the defect which occurred in the repetitive pattern becomes weak. Thus, the diffracted light with the error is likely to be buried in the diffracted light with no error component.

Further, the following reason is considered as another cause. That is, as the substrate for the display device such as the liquid crystal display panel, there is a TV panel. In this case, even when the panel size increases, the number of pixels does not basically change. Therefore, the period of a repetitive pattern increases to about 100 to 1000 μm in the case of a photomask for manufacturing a large-size display device substrate. On the other hand, an allowable variation value for a variation in position or line width of a unit pattern generated in the repetitive pattern does not increase in proportion to the period of the repetitive pattern (e.g. within about 100 nm). The ratio of the allowable variation value to the period of the repetitive pattern is, for example, 0.1% when the period of the repetitive pattern is 100 μm and 0.01% when the period of the repetitive pattern is 1000 μm in the case of the allowable variation value being 100 nm. Accordingly, also from this reason, as the period of the repetitive pattern increases, it becomes more difficult to detect a defect such as variation in position or line width of unit patterns.

This invention has been made under the foregoing circumstances and has an object to provide a pattern defect inspection method that can satisfactorily inspect a defect such as variation in position or line width of a unit pattern in a repetitive pattern in a short time, a photomask manufacturing method for manufacturing a photomask by carrying out such a defect inspection, and a display device substrate manufacturing method for manufacturing a display device substrate using such a photomask.

According to claim 1, a pattern defect inspection method is for inspecting a defect which occured in a main pattern of an inspection object. The main pattern includes a repetitive pattern in which unit patterns are periodically arranged. The method comprises:

forming, an auxiliary pattern for inspection simultaneously with forming the main pattern in a region of other than the main pattern, the auxiliary pattern including a repetitive pattern having a period different from that of the main pattern;

irradiating a light onto the auxiliary pattern at a predetermined incident angle, and receiving diffracted light generated by the auxiliary pattern by observation means to detect a defect of the auxiliary pattern, thereby determining the presence of a defect of the main pattern.

According to claim 2, in the pattern defect inspection method claimed in claim 1, the period of the auxiliary pattern is smaller than that of the main pattern.

According to claim 3, in the pattern defect inspection method claimed in claim 2, the period of the main pattern is 80 to 2000 μm and the period of the auxiliary pattern is 1 to 50 μm.

According to claim 4, in the pattern defect inspection method claimed in claim 2, the auxiliary pattern is formed by periodically arranging unit patterns in both directions perpendicular to each other.

According to claim 5, in the pattern defect inspection method claimed in claim 2, the inspection object is a photomask for manufacturing a display device substrate or a display device substrate.

According to claim 6, a photomask manufacturing method is for manufacturing a photomask comprising a main pattern including a repetitive pattern in which unit patterns are periodically arranged. The method comprises:

a pattern forming step for forming an auxiliary pattern for inspection outside of the main pattern simultaneously with forming the main pattern, the auxiliary pattern including a repetitive pattern having a period different from that of the main pattern; and a defect inspection step, wherein the defect inspection step comprises irradiating a light onto the auxiliary pattern at a predetermined incident angle and receiving diffracted light generated by the auxiliary pattern by observation means to detect a defect of the auxiliary pattern, thereby determining the presence of a defect of the main pattern.

According to claim 7, a photomask manufacturing method is for manufacturing a photomask having a main pattern including a repetitive pattern in which unit patterns are periodically arranged. The method comprises:

a pattern forming step for forming an auxiliary pattern for inspection outside of the main pattern simultaneously with forming the main pattern on a surface of a photomask blank in which a thin film and a resist film are formed on a transparent substrate, the auxiliary pattern including a repetitive pattern having a period different from that of the main pattern, a defect inspection step comprising irradiating a light onto the auxiliary pattern at a predetermined incident angle and receiving diffracted light generated by the auxiliary pattern by observation means to detect a defect of the auxiliary pattern; and an auxiliary pattern eliminating step for eliminating the auxiliary pattern.

Accoding to claim 8, in the photomask manufacturing method claimed in claim 7:

said pattern forming step is performed by writing the auxiliary pattern simultaneously with the main pattern, and developing a resist pattern of the auxiliary pattern; and said defect inspection step is performed by irradiating a light onto the resist pattern of the auxiliary pattern and receiving diffracted light of reflected light generated by the auxiliary pattern by the observation means.

According to claim 9, in the photomask manufacturing method claimed in claim 8, the auxiliary pattern eliminating step includes the step of removing the resist pattern of the auxiliary pattern.

According to claim 10, in the photomask manufacturing method claimed in claim 7, the auxiliary pattern eliminating step includes the step of removing the thin film at a portion corresponding to the auxiliary pattern.

Accoding to claim 11, in the photomask manufacturing method claimed in claim 8, the auxiliary pattern eliminating step includes the step of removing the thin film at a portion corresponding to the auxiliary pattern.

According to claim 12, in the photomask manufacturing method claimed in claim 7:

said pattern forming step is performed by writing the auxiliary pattern simultaneously with the main pattern and forming, developing, and etching a thin film pattern of the auxiliary pattern; and said defect inspection step is performed by irradiating a light onto the thin film pattern of the auxiliary pattern and receiving diffracted light of reflected light or transmitted light generated by the auxiliary pattern by the observation means.

According to claim 13, in the photomask manufacturing method claimed in claim 11, the auxiliary pattern eliminating step includes the step of removing a pattern of the thin film at a portion corresponding to the auxiliary pattern.

According to claim 14, in the photomask manufacturing method claimed in claim 6, the period of the auxiliary pattern is smaller than that of the main pattern.

According to claim 15, in the photomask manufacturing method claimed in claim 7, the period of the auxiliary pattern is smaller than that of the main pattern.

According to claim 16, in the photomask manufacturing method claimed in claim 6, the period of the main pattern is 80 to 2000 μm and the period of the auxiliary pattern is 1 to 50 μm.

According to claim 17, in the photomask manufacturing method claimed in claim 7, the period of the main pattern is 80 to 2000 μm and the period of the auxiliary pattern is 1 to 50 μm.

Accoding to claim 18, in the photomask manufacturing method claimed in claim 6, the auxiliary pattern is formed by periodically arranging unit patterns in directions perpendicular to each other.

According to claim 19, in the photomask manufacturing method claimed in claim 7, the auxiliary pattern is formed by periodically arranging unit patterns in directions perpendicular to each other.

According to claim 20, a display device substrate manufacturing method comprises forming a pixel pattern using the photomask manufactured by the photomask manufacturing method claimed in claim 6, thereby manufacturing a display device substrate.

According to claim 21, a display device substrate manufacturing method comprises forming a pixel pattern using the photomask manufactured by the photomask manufacturing method claimed in claim 7, thereby manufacturing a display device substrate.

According to the invention as recited in any one of claims 1 to 5, even when the period of the repetitive pattern in the main pattern is so large that a defect such as variation in position or line width of the unit patterns in this repetitive pattern cannot be recognized as an error of diffracted light from the main pattern, by receiving diffracted light generated by the auxiliary pattern formed by being written simultaneously with the main pattern and including the repetitive pattern having the period different from that of the main pattern, the foregoing defect generated in the repetitive pattern of the auxiliary pattern is detected as an error of the diffracted light. Herein, "being written simultaneously with the main pattern" represents that the auxiliary pattern is also written in writing scanning of the main pattern and, therefore, the condition is such that a defect (such as variation in position or line width) generated during writing of the main pattern also occurs in the auxiliary pattern. Accordingly, it is possible to satisfactorily determine the presence of the defect in the repetitive pattern of the main pattern.

Further, since it is not necessary to detect a defect, such as variation in position or line width of the unit patterns, with respect to all the unit patterns forming the repetitive pattern in the main pattern, the presence of the defect can be determined in a short time, thereby improving the productivity.

According to the invention as recited in any one of claims 7 to 13, 15, 17, 19 and 21, after performing the defect inspection step that inspects the defect of the auxiliary pattern formed by being written simultaneously with the main pattern, the auxiliary pattern eliminating step of eliminating the auxiliary pattern is performed to thereby manufacture the photomask. Therefore, the photomask as a final product can be prevented from being formed with the auxiliary pattern.

According to the invention as recited in claim 21, the display device substrate is manufactured by forming the pixel pattern using the photomask manufactured by the photomask manufacturing method according to any one of claims 6 to 18. Therefore, it is possible to improve the quality of the display device substrate.

BRIEF DESCRIPTION OF THE DRAWINGS

FIGS. 4A to 4D each show a defect generated in the repetitive pattern of the main pattern or the auxiliary pattern in the photomask shown in FIGS. 1 to 3B, wherein FIGS. 4A and 4B are schematic diagrams each showing the defect on the basis of coordinate position variation and FIGS. 4C and 4D are schematic diagrams each showing the defect on the basis of size variation;

DESCRIPTION OF THE PREFERRED EMBODIMENTS

Hereinbelow, the best modes for carrying out this invention will be described with reference to the drawings.

[A] First Embodiment (FIGS. 1 to 7B)

Figure 1:
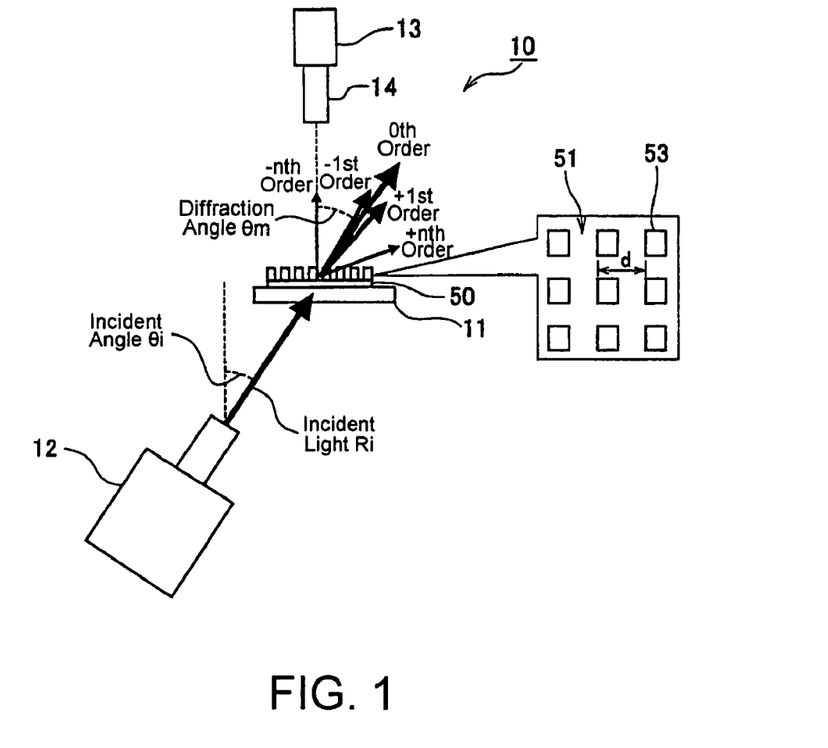
FIG. 1 is a schematic side view showing a defect inspection apparatus for carrying out a defect inspection method according to a first embodiment of this invention.
Figure 2:
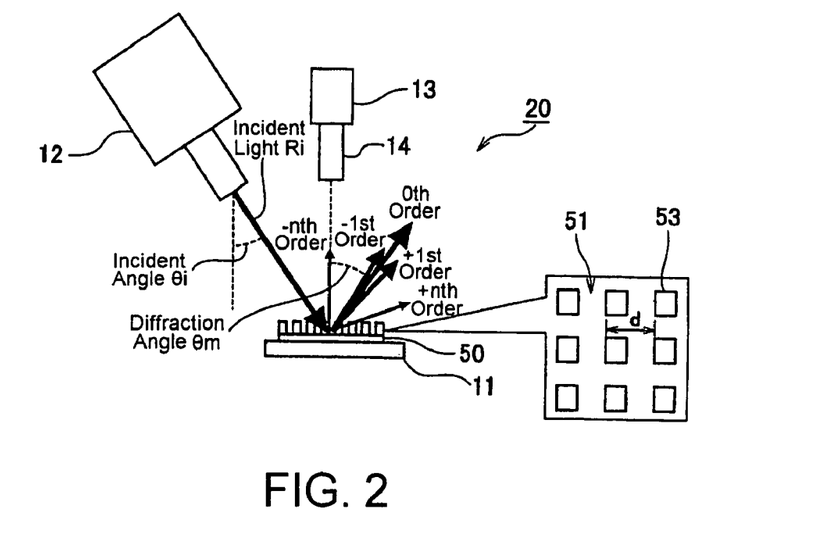
FIG. 2 is a schematic side view showing a modification of the defect inspection apparatus shown in FIG. 1.
Figure 3A:
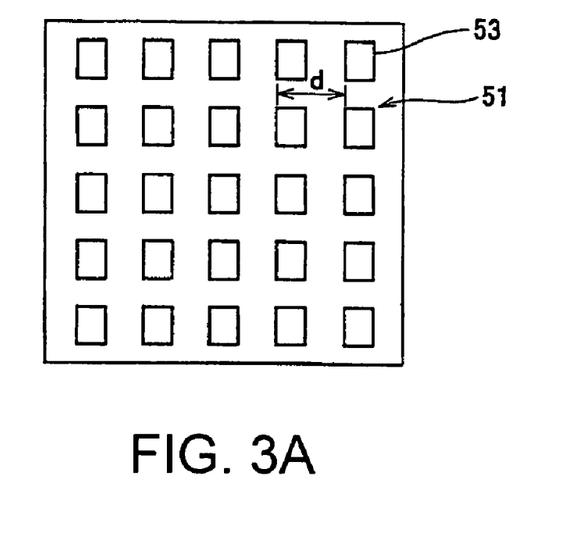
FIGS. 3A and 3B are diagrams for explaining a repetitive pattern of a main pattern or an auxiliary pattern in a photomask shown in FIGS. 1 and 2 and for explaining diffracted light from the repetitive pattern of the auxiliary pattern and so on, respectively.
Figure 3B:
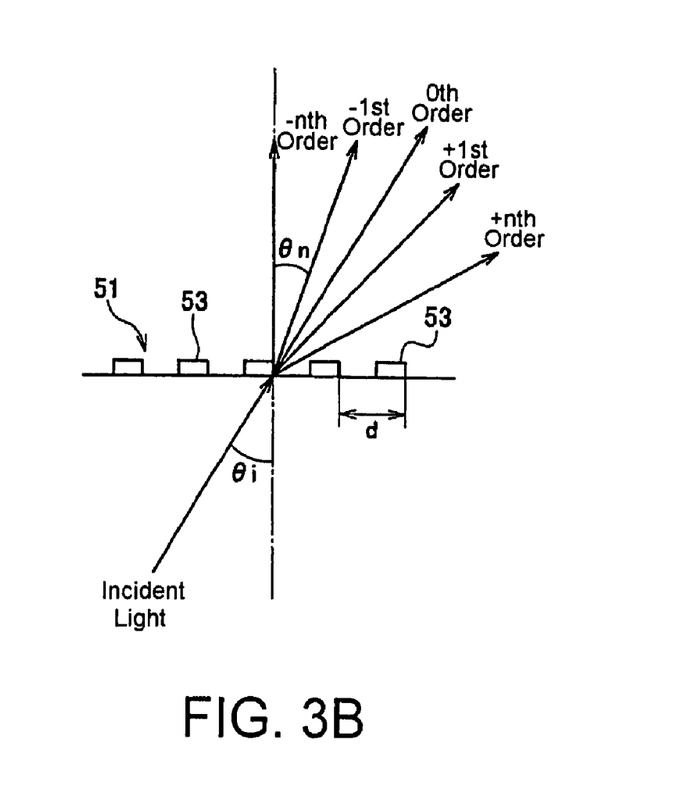
Figure 5:
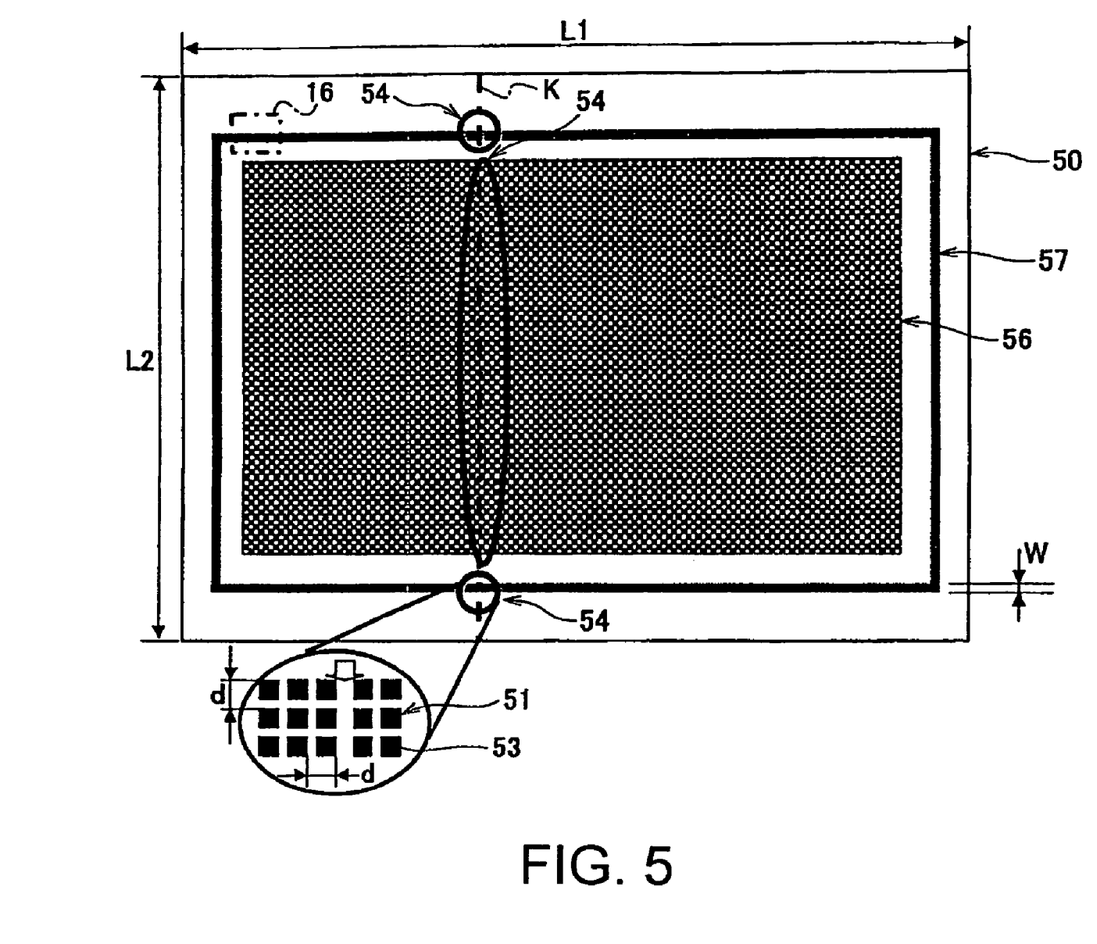
FIG. 5 is a plan view showing a photomask as an inspection object to be inspected in the defect inspection method of FIGS. 1 and 2.

FIG. 1 is a schematic side view showing a defect inspection apparatus for carrying out a defect inspection method according to the first embodiment of this invention. FIG. 2 is a schematic side view showing a modification of the defect inspection apparatus shown in FIG. 1. FIG. 5 is a plan view showing a photomask as an inspection object to be inspected in the defect inspection method of FIGS. 1 and 2.

As shown in FIG. 5, a photomask 50 as an inspection object to be inspected in the defect inspection method of this embodiment is an exposure mask for use in manufacturing a substrate for a display device such as a liquid crystal display (particularly a flat panel display: FPD), a plasma display, an EL display, a LED display, or a DMD display.

The photomask 50 comprises a transparent substrate such as a synthetic quartz glass substrate and a thin film (light-shielding film) such as a chromium film formed on the surface of the transparent substrate, wherein the thin film is partially removed into a predetermined pattern which serves as a mask pattern. The thin film may be in the form of a single layer or stacked layers and may have a light-semitransmissive film or a functional film serving as an etching stopper or the like in addition to a light-shielding film. The mask pattern comprises a main pattern 56 and an auxiliary pattern 57 for inspection formed in an outer peripheral region of the main pattern 56. As shown in FIGS. 1 to 3B, the main pattern 56 and the auxiliary pattern 57 each have a repetitive pattern 51 in which unit patterns 53 are periodically arranged. The periods of the repetitive patterns 51 of the patterns 56 and 57 are set to be different from each other.

The period of the main pattern 56, i.e. a pitch of the repetitive pattern 51 in the main pattern 56, is set, for example, to 80 to 2000 μm. On the other hand, the period of the auxiliary pattern 57, i.e. a pitch d of the repetitive pattern 51 in the auxiliary pattern 57, is set, for example, to 1 to 50 μm (10 μm in this embodiment). Inspection is easier as the period of the auxiliary pattern is smaller. However, in terms of the resolution limit of observation means and the influence to the auxiliary pattern due to processes such as development, the period of the auxiliary pattern is preferably 1 μm or more. On the other hand, if it is too large, an error component of diffracted light increases and, therefore, it is preferably 50 μm or less. More preferably, it is 2 to 40 μm. When the period of the main pattern is 80 to 2000 μm, an effect according to this embodiment is markedly achieved. Further, when it is 100 to 1000 μm, the effect is more marked.

As shown in FIG. 5, the repetitive pattern 51 in the auxiliary pattern 57 is configured such that the unit patterns 53 are periodically arranged along sides L1 and L2 perpendicular to each other in the photomask 50. A width W of the auxiliary pattern 57 is preferably set to 1 to 5 mm when a defect inspection is carried out by the inspection apparatus, while, about 5 to 20 mm is preferable when a defect inspection is carried out by visual observation. The effect of this invention is remarkable when the photomask 50 has, for example, a side of 300 mm or more, and the photomask 50 may be in the form of a large-size substrate with the side L1 or L2 exceeding 1 m.

Generally, as a method of manufacturing a photomask of this type, a thin film (light-shielding film) is first formed on a transparent substrate and then a resist film is formed on the thin film. Then, a beam of a laser in a writing apparatus is irradiated onto the resist film to apply writing thereto using a raster writing technique, thereby exposing a predetermined pattern. Then, written and non-written portions are selectively removed, thereby forming a resist pattern. Thereafter, the thin film is etched using the resist pattern as a mask, thereby forming the thin film into a repetitive pattern (mask pattern). Finally, the remaining resist is removed, thereby manufacturing a photomask. Naturally, in the case of a multilayer film, additional processes can be provided according to materials of the film.

In the foregoing manufacturing method, there is a case where when directly applying the writing to the resist film by scanning of the laser beam according to the raster writing technique, the line width or the position varies depending on the scanning accuracy, the diameter of the beam, or the scan width, so that errors due to writing failure periodically occur on the basis of writing units. This is one cause of occurrence of a defect in the repetitive pattern. Other than this, pattern defects each having a regularity may be generated due to various other causes.

Figure 4A:
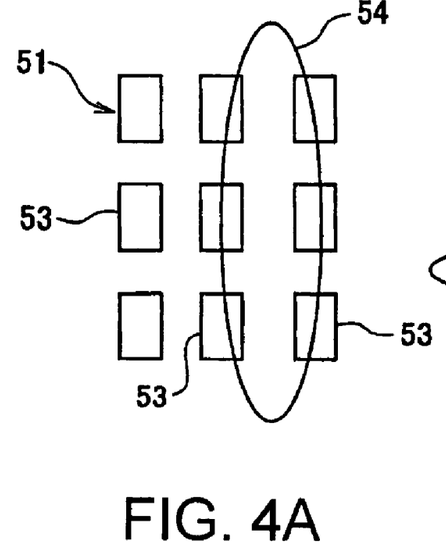
Figure 4B:
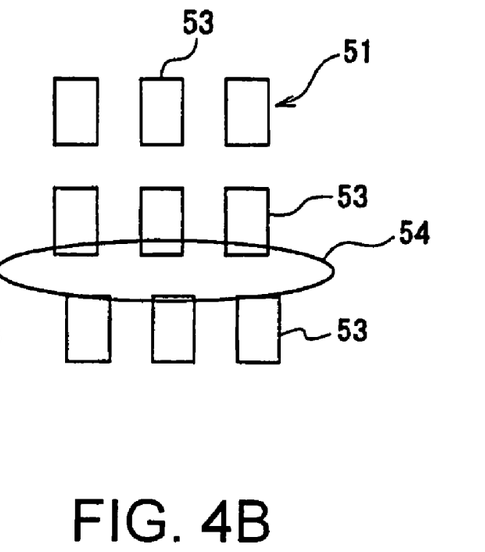
Figure 4C:
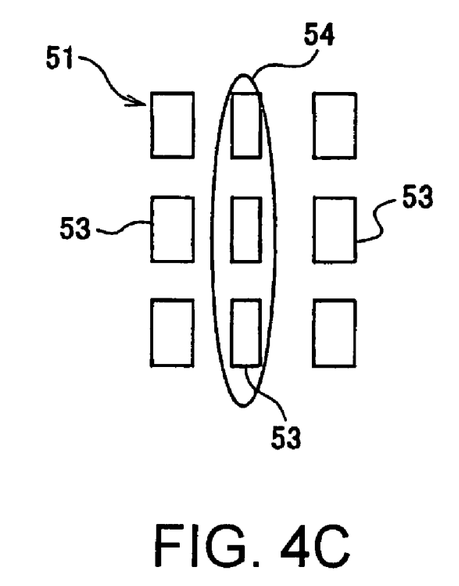
Figure 4D:
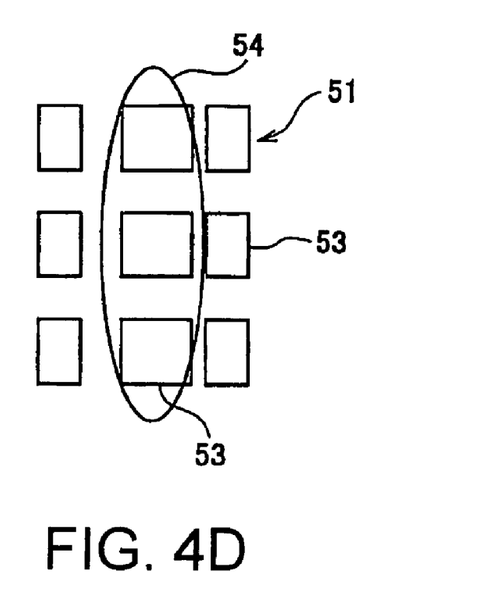

FIGS. 4A to 4D show examples of those defects. In each of FIGS. 4A to 4D, a defect region is denoted by numeral 54. FIG. 4A shows a defect caused by the fact that the intervals between unit patterns 53 in a repetitive pattern 51 partly differ due to occurrence of a position offset (position variation) at a seam of writing by a beam. Likewise, FIG. 4B shows a defect caused by the fact that the positions of unit patterns 53 in a repetitive pattern 51 are offset with respect to other unit patterns 53 due to occurrence of a position offset at a seam of writing by a beam. These defects shown in FIGS. 4A to 4B are each called a defect on the basis of coordinate position variation. On the other hand, FIGS. 4C and 4D each show a defect caused by the fact that the line width of unit patterns 53 in a repetitive pattern 51 partly decreases or increases due to variation in beam intensity of the writing apparatus or the like. This defect is called a defect on the basis of size variation.

Even if it is attempted to detect, by a macro inspection using diffracted light, the foregoing defect on the basis of coordinate position variation (i.e. the defect caused by the position variation of the unit patterns 53) or the foregoing defect on the basis of size variation (i.e. the defect caused by the line width variation of the unit patterns 53) in the main pattern 56 shown in FIG. 5, since the period of the main pattern 56 is large, for example, 100 to 1000 μm, as described above, it is difficult to recognize the defect as an error of the diffracted light and thus it is difficult to inspect the defect. In view of this, the auxiliary pattern 57, having the repetitive pattern 51 with the pitch d that enables a defect such as variation in position or line width of the unit patterns 53 to be recognized as an error of the diffracted light relatively easily, is formed simultaneously with forming the main pattern 56.

Since the auxiliary pattern 57 is formed simultaneously with forming the main pattern 56, variation in position or line width of the unit patterns 53 caused by fluctuation in accuracy of the writing apparatus or the like occurs on the same straight line K and in the same variation amount on each of the main pattern 56 and the auxiliary pattern 57. Therefore, by detecting a defect in the auxiliary pattern 57 by a macro inspection using diffracted light, it is possible to inspect that a defect in an equivalent variation amount is present in the main pattern 56 on the same straight line K where the defect occurs in the auxiliary pattern 57.

As shown in FIG. 1, a defect inspection apparatus 10 for inspecting a defect such as variation in position or line width of the unit patterns 53 generated in the auxiliary pattern 57 comprises a stage 11, a light source apparatus 12, and an observation apparatus 13 as observation means. The observation apparatus 13 has a light-receiving optical system 14.

The stage 11 is a platform having a support surface adapted to support the photomask 50 thereon. The stage 11 is an X-Y stage movable in X and Y directions, thereby moving the photomask 50 with respect to an inspection field 16 (FIG. 5). The inspection field 16 is a field of view that is detectable by one inspection and is set, for example, to a rectangular shape having a side of 10 to 50 mm. Alternatively, the stage 11 may be fixed and the light source apparatus 12 or the observation means 13 may be set movable.

The light source apparatus 12 uses a light source having sufficient luminance (e.g. illuminance is 10000 to 600000 Lx, preferably 300000 Lx or more) and high parallelism (parallel degree is within 20). The light source that can satisfy such conditions is preferably an ultra-high pressure mercury lamp, a xenon lamp, or a metal halide lamp. The light source apparatus 12 is disposed below the stage 11. A light from the light source apparatus 12 is irradiated obliquely from below at a predetermined incident angle θi onto the repetitive pattern 51 in the auxiliary pattern 57 of the photomask 50 supported on the stage 11.

The observation apparatus 13 can use, for example, a CCD camera having an objective lens as an imaging device and is disposed at a position facing perpendicular to the support surface of the stage 11 or at a position facing the support surface of the stage 11 at a predetermined angle. The observation apparatus 13 receives, through the light-receiving optical system 14, diffracted light of light transmitted through the photomask 50 and captures it by the CCD cameral as image information. As shown in FIG. 2, use may be made of a pattern defect inspection apparatus 20 in which a light source apparatus 12 is disposed on the same side as an observation apparatus 13 with respect to a stage 11. In this case, the light from the light source apparatus 12 is irradiated onto the auxiliary pattern 57 of the photomask 50 at an incident angle θi and the observation apparatus 13 receives diffracted light of light reflected by the auxiliary pattern 57 of the photomask 50.

In diffracted light of the light transmitted through or reflected by the photomask 50, the observation apparatus 13 receives the diffracted light of an order with an absolute value greater than zero. Herein, the following relational expression (1) is established between irradiation light (incident light) irradiated onto the repetitive pattern 51 in the auxiliary pattern 57 of the photomask 50 and diffracted light from the repetitive pattern 51 of the auxiliary pattern 57.

$$d(\sin \theta n \pm \sin \theta i) = n\lambda \tag{1}$$

where, as shown in FIGS. 1 to 3B, d represents a pitch of the repetitive pattern 51, θi an incident angle, θn a diffraction angle of nth-order diffracted light of an order n, and λ a wavelength of incident light.

0th-order diffracted light (direct light) includes a relatively very small amount of fine defect information and diffracted light of an order with a greater absolute value includes a relatively larger amount of fine defect information. Accordingly, in order to obtain fine defect information, it is necessary that the observation apparatus 13 receive diffracted light (nth-order diffracted light) of an order with an absolute value greater than zero. The diffraction order n is determined based on the pitch d of the repetitive pattern 51 of the auxiliary pattern 57. Therefore, in order to enable the observation apparatus 13 to receive predetermined nth-order diffracted light for a predetermined pitch d in the repetitive pattern 51 of the auxiliary pattern 57, a direction of the nth-order diffracted light (nth-order diffraction angle θn), a wavelength λ of incident light, and an incident angle θi are properly set according to the relational expression (1). In FIGS. 1 to 3B, the nth-order diffraction angle θn represents a diffraction angle of −1st-order diffraction.

Since the observation apparatus 13 uses the camera such as the CCD camera as the imaging device, an image captured by the CCD camera can be displayed on a display screen and, further, the captured image can be analyzed as image data by an analyzer (not shown). This CCD camera is an area camera adapted to capture a two-dimensional image and its field of view is the foregoing inspection field 16. The observation apparatus 13 may be provided with an eyepiece.

Image data obtained by the observation apparatus 13 is sent to a non-illustrated analyzer. This analyzer provides threshold values to the image data itself from the observation apparatus 13 to thereby discriminate and inspect a defect of the repetitive pattern 51 (defect such as variation in position or line width of the unit patterns 53) in the auxiliary pattern 57 of the photomask.

Hereinbelow, the manufacturing method of the photomask 50 shown in FIG. 5 will be described.

The manufacturing method of the photomask 50 carries out a mask blank manufacturing process, a resist pattern forming process, a mask pattern forming process, and a defect inspection process in the order named.

The mask blank manufacturing process forms a thin film such as a light-shielding film on the surface of a transparent substrate and then coats a resist on the thin film to form a resist film, thereby manufacturing a mask blank having a layered structure.

The resist pattern forming process irradiates, for example, a laser beam onto the resist film of the mask blank using a writing apparatus to apply writing to the resist film using a raster writing technique, thereby exposing a predetermined pattern on the resist film, and then develops it to form a resist pattern. The resist pattern includes patterns for forming the main pattern 56 and the auxiliary pattern 57, which were simultaneously written on the resist film and developed so as to be formed.

The mask pattern forming process etches the foregoing thin film using the resist pattern as a mask, thereby simultaneously writing the main pattern 56 and the auxiliary pattern 57 on the thin film. In this event, the period of the repetitive pattern 51 in the main pattern 56 is set, for example, to 80 to 2000 μm, while, the period (pitch d) of the repetitive pattern 51 in the auxiliary pattern 57 is set, for example, to 1 to 50 μm. The auxiliary pattern 57 is set to have a width W of, for example, 1 to 5 mm and is formed in an outer peripheral region of the main pattern 56.

Figure 6:
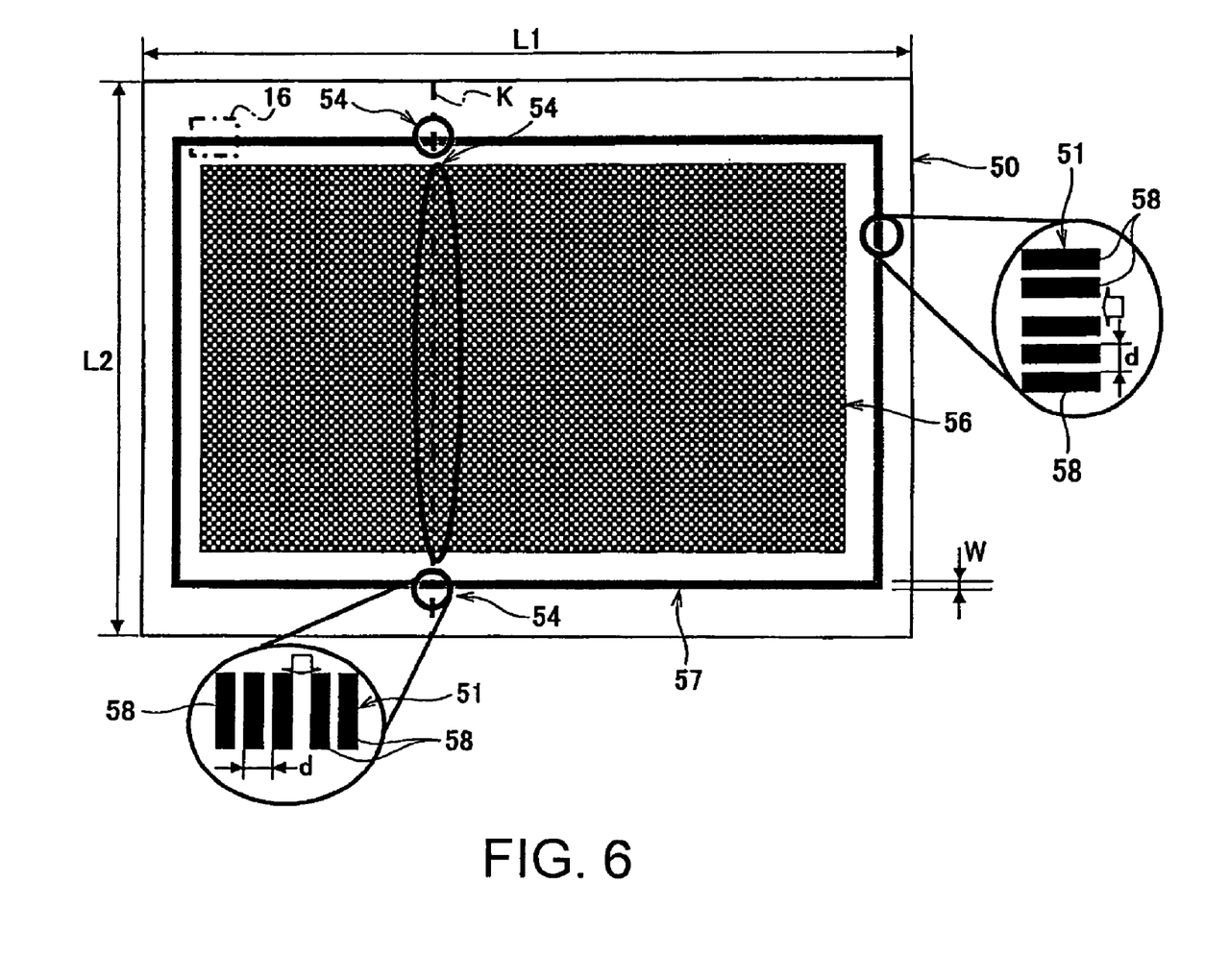
FIG. 6 is a plan view showing a photomask in which the shape of each of unit patterns of an auxiliary pattern differs from that of the photomask shown in FIG. 5.

The repetitive pattern 51 of the auxiliary pattern 57 is not limited to the pattern in which the unit patterns 53 are periodically arranged in directions perpendicular to each other, but may be a pattern composed of strip-like unit patterns 58 as shown in FIG. 6. The unit patterns 58 are each arranged with its longitudinal direction oriented perpendicular to a side L1 or L2 of a photomask 50. A pitch d of the repetitive pattern 51 composed of the unit patterns 58 may also be set, for example, to 1 to 50 μm.

Figure 7A:
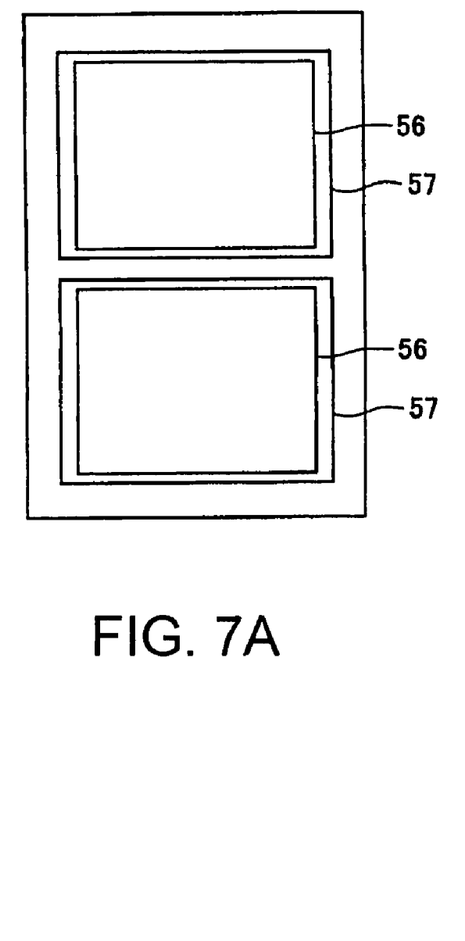
FIGS. 7A and 7B are plan views each showing a substrate formed with main patterns of two photomasks.
Figure 7B:
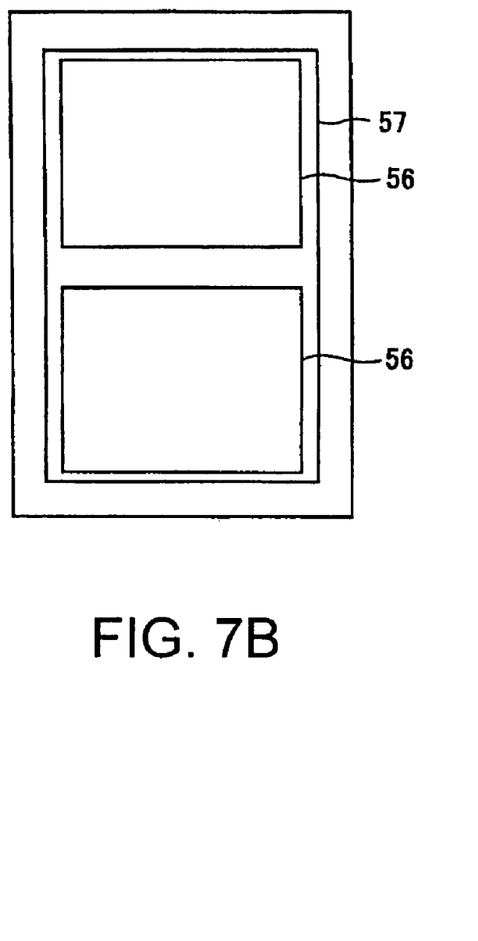

Further, main patterns 56 of two to four photomasks 50 may be formed on a single substrate. FIGS. 7A and 7B each show a substrate formed with main patterns 56 of two photomasks 50. In this case, auxiliary patterns 57 may be formed in outer peripheral regions of the main patterns 56, respectively (FIG. 7A), or an auxiliary pattern 57 may be formed in an outer peripheral region surrounding the whole of the main patterns 56 (FIG. 7B).

The defect inspection process, after the formation of the thin film patterns of the main pattern 56 and the auxiliary pattern 57 (hereinafter simply referred to as the main pattern 56 and the auxiliary pattern 57 in this embodiment), irradiates a light onto the repetitive pattern 51 of the auxiliary pattern 57 at a predetermined incident angle θi using the defect inspection apparatus 10 or 20 of FIG. 1 or 2 and receives diffracted light from the repetitive pattern 51 of the auxiliary pattern 57 using the observation apparatus 13, thereby defecting a defect in the repetitive pattern 51 (defect such as variation in position or line width of the unit patterns 53 of the repetitive pattern 51) of the auxiliary pattern 57. Since the auxiliary pattern 57 and the main pattern 56 are formed using the corresponding patterns of the resist pattern that were simultaneously written by the raster writing technique, if the foregoing defect occurs in the repetitive pattern 51 of the auxiliary pattern 57, a similar defect in the same variation amount also occurs in the repetitive pattern 51 of the main pattern 56 on the same straight line K where the foregoing defect of the auxiliary pattern 57 is present. Therefore, by detecting a defect of the repetitive pattern 51 in the auxiliary pattern 57, it is possible to easily determine the presence of a defect of the repetitive pattern 51 (defect such as variation in position or line width of the unit patterns 53 of the repetitive pattern 51) in the main pattern 56.

The foregoing defect inspection process is performed as a part of the manufacturing method of the photomask 50. Using the photomask 50 and exposure light, the mask pattern of the photomask 50 is transferred onto a resist film formed on a transfer-destination substrate, and a pixel pattern based on this transferred pattern is formed on the surface of the transfer-destination substrate, thereby manufacturing a display device substrate. This pixel pattern is, for example, a repetitive pattern of thin film transistors, an opposed substrate, or color filters of a liquid crystal display panel.

According to this embodiment thus configured, the following effects (1) to (3) are achieved.

(1) In the photomask 50, there is a case where the period of the repetitive pattern 51 in the main pattern 56 is so large that a defect such as variation in position or line width of the unit patterns 53 in this repetitive pattern 51 cannot be recognized as an error of diffracted light from the main pattern 56. In this case, by receiving diffracted light generated by the auxiliary pattern 57 formed simultaneously with forming the main pattern 56 and including the repetitive pattern 51 having the period (pitch d) different from that of the main pattern 56, a defect, such as variation in position or line width of the unit patterns 53, generated in the repetitive pattern 51 of the auxiliary pattern 57 is detected as an error of the diffracted light.

It is possible to conclude that when the foregoing defect occurs in the auxiliary pattern 57 formed simultaneously with forming the main pattern 56, a similar defect occurs in the main pattern 56 on the straight line K including a position where the defect of the auxiliary pattern 57 occurs. Therefore, by detecting a defect in the repetitive pattern 51 of the auxiliary pattern 57, it is possible to satisfactorily determine the presence of a defect such as variation in position or line width of the unit patterns 53 in the repetitive pattern 51 of the main pattern 56.

(2) since it is not necessary to detect a defect, such as variation in position or line width of the unit patterns 53, with respect to all the unit patterns 53 forming the repetitive pattern 51 in the main pattern 56 of the photomask 50, the presence of the defect can be determined in a short time, thereby improving the productivity.

That is, a defect such as variation in position or line width of the unit patterns 53 of the repetitive pattern 51 in the main pattern 56 of the photomask 50 cannot be detected by a general micro inspection based on comparison with design data, the adjacent unit pattern 53, or the like using a microscope or the like. If a laser length measuring apparatus with a laser interferometer is used, it is possible to measure variation in position or line width of all the unit patterns 53 in the repetitive pattern 51 of the main pattern 56. In this case, assuming that the photomask 50 is used for manufacturing a display device substrate for high-definition TV, the number of pixels of the display device substrate is 1920 (vertical)×1080 (horizontal)=2,073,600 and the photomask 50 has the same number of unit patterns 53. Assuming that a measurement time required for each unit pattern is about 10 seconds, about 240 days are required for measuring all the unit patterns 53. Particularly, in the case of FPD manufacturing photomasks 50, there is a case where repetitive patterns 51 of two to four photomasks 50 are formed on a single substrate and, in this case, a defect inspection of unit patterns 53 requires an even longer time.

The occurrence of a defect such as variation in position or line width of the unit patterns 53 in the repetitive pattern 51 of the photomask 50 is caused by fluctuation of a writing apparatus that forms the repetitive pattern 51, or the like. Since the writing apparatus controls the writing position using an X-Y stage, there is a very high possibility that the defect continuously occurs in the vertical or horizontal direction. Accordingly, by inspecting only one row of the repetitive pattern 51 of the photomask 50 in each of the horizontal and vertical directions, the defect can be detected. However, even by performing this two-direction inspection using the foregoing laser length measuring apparatus, about 8 hours are required when a repetitive pattern 51 of one photomask 50 is formed on a single substrate and about 32 hours are required when repetitive patterns 51 of four photomasks 50 are formed on a single substrate, and thus the productivity is still low.

As opposed to the foregoing inspection, if, as in this embodiment, the defect inspection of the main pattern 56 is carried out by macro-inspecting a defect of the auxiliary pattern 57 using diffracted light, assuming that the inspection field 16 is, for example, 10 mm square, a time for one inspection is about 10 seconds, and the side L1 of the photomask 50 is 1400 mm and the other side L2 perpendicular to the side L1 is 850 mm, even when a two-direction inspection is carried out in the horizontal and vertical directions from end to end of the photomask 50, the inspection can be completed in about 38 minutes and thus the productivity is high. Further, when the period (pitch d) of the repetitive pattern 51 in the auxiliary pattern 57 of the photomask 50 is, for example, 12 μm, a defect can be clearly inspected naturally when an amount of variation in position or line width of the unit patterns 53 in the repetitive pattern 51 is 100 nm and even when it is 10 nm.

(3) Since the pixel pattern is formed using the photomask 50 manufactured by the foregoing photomask manufacturing method to thereby manufacture the display device substrate (e.g. liquid crystal display panel), it is possible to provide the display device substrate having the pixel pattern with no defect.

Figure 8:
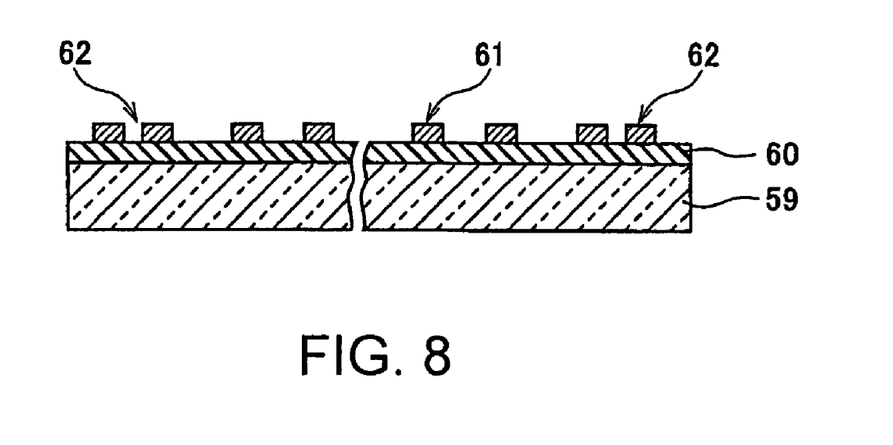
FIG. 8 is a side sectional view showing a photomask to be inspected in a defect inspection method according to a second embodiment of this invention.

[B] Second Embodiment (FIG. 8)

FIG. 8 is a side sectional view showing a photomask to be inspected in a defect inspection method according to the second embodiment of this invention. The second embodiment differs from the foregoing first embodiment in that a defect inspection process is performed after a resist pattern forming process and, thereafter, a process of eliminating a resist pattern for an auxiliary pattern 57, and a process of forming a mask pattern, i.e. a thin film pattern of a main pattern 56, are performed in the order named.

That is, in the resist pattern forming process, resist patterns 61 and 62 for forming the main pattern 56 and the auxiliary pattern 57, respectively, are written on a resist film on a thin film 60 formed on the surface of a transparent substrate 59 using a writing apparatus according to a raster writing technique, and then are developed so as to be formed.

In the defect inspection process, a light is irradiated onto the resist pattern 62, after the development, for the auxiliary pattern 57 at a predetermined incident angle θi using the defect inspection apparatus 10 or 20 of FIG. 1 or 2 and, by receiving diffracted light from the resist pattern 62 using the observation apparatus 13, a defect of the resist pattern 62 is detected, thereby determining the presence of a similar defect in the resist pattern 61 for the main pattern 56. These defects are defects such as variation in position or line width of unit patterns in repetitive patterns forming the resist pattern 61 for the main pattern 56 and the resist pattern 62 for the auxiliary pattern 57.

The process of eliminating the resist pattern 62 for the auxiliary pattern 57 is a process of eliminating the resist pattern 62 after carrying out the defect inspection process that detects the defect of the resist pattern 62. Specifically, the resist pattern 62 is eliminated by coating a resist only on the resist pattern 62, thereby causing the thin film 60 to remain at a portion corresponding to the resist pattern 62 for the auxiliary pattern 57 in the subsequent mask pattern forming process. Alternatively, exposure and development are applied only to the resist pattern 62 for the auxiliary pattern 57 to remove the resist pattern 62 so as to eliminate it, thereby removing the thin film 60 at a portion corresponding to the resist pattern 62 by etching in the subsequent mask pattern forming process.

The mask pattern forming process is a process of forming the thin film 60 into the main pattern 56 as a mask pattern (thin film pattern) by etching using, as a mask, the resist pattern in which the resist pattern 62 for the auxiliary pattern 57 is eliminated and only the resist pattern 61 for the main pattern 56 remains. Accordingly, the thin film 60 is not formed with the auxiliary pattern 57.

Therefore, according to this second embodiment, the following effect (4) is achieved in addition to the foregoing effects (1) to (3) of the first embodiment.

(4) The resist film on the thin film 60 formed on the surface of the transparent substrate 59 is formed with the resist pattern 61 for the main pattern 56 and the resist pattern 62 for the auxiliary pattern 57 and, after performing the defect inspection process, the process of eliminating the resist pattern 62 for the auxiliary pattern 57 is performed, and thereafter, the mask pattern forming process is performed in which the thin film 60 is formed with the main pattern 56 as the mask pattern using the resist pattern 61 as the mask. Accordingly, a photomask 50 as a final product is prevented from being formed with the auxiliary pattern 57 and thus is the same in appearance as a normal photomask.

[C] Third Embodiment

A pattern defect inspection method according to the third embodiment differs from the foregoing second embodiment in an auxiliary pattern eliminating process.

That is, in this third embodiment, after performing a defect inspection using a resist pattern 62 for an auxiliary pattern 57, etching is carried out to form a thin film pattern of a main pattern 56 (i.e. the main pattern 56 in the first embodiment) and a thin film pattern of an auxiliary pattern 57 (i.e. the auxiliary pattern 57 in the first embodiment) and then resist stripping is performed, thereby fabricating a temporary photomask.

Thereafter, a resist is again coated on the entire surface of the temporary photomask and then only a portion of the resist corresponding to the auxiliary pattern 57 is exposed. This exposure may be scanning exposure by a writing apparatus or surface exposure only at such a portion. After the exposure, development is again performed and then etching is again performed, thereby removing the auxiliary pattern 57 so as to eliminate it. Thereafter, the resist is stripped to thereby manufacture a photomask.

Accordingly, also in this third embodiment, the photomask as a final product is not formed with the auxiliary pattern 57 and thus the same effects as those in the foregoing second embodiment are achieved.

[D] Fourth Embodiment

A pattern defect inspection method according to the fourth embodiment fabricates a photomask by forming a thin film 60 into thin film patterns of a main pattern 56 and an auxiliary pattern 57 in the same manner as in the foregoing first embodiment and, using the thin film pattern of the auxiliary pattern 57 in the photomask, carries out a defect inspection in the same manner as in the first embodiment. Then, a resist is again coated on the entire surface of the photomask and, in the same manner as in the third embodiment, the auxiliary pattern 57 is removed so as to disappear.

Accordingly, in this fourth embodiment, a defect of a repetitive pattern 51 can be inspected in the same manner as in the foregoing first embodiment and, further, in the same manner as in the third embodiment, it is possible to obtain the photomask as a final product in which the auxiliary pattern 57 used in the defect inspection does not exist.

While this invention has been described in terms of the embodiments, the invention is not to be limited thereto.

For example, in the foregoing embodiments, the inspection object is the photomask 50 for use in manufacturing a display device substrate and a defect which occurred in the repetitive pattern 51 of the photomask 50 is inspected. However, the inspection object may be the display device substrate. In this case, a defect which occurred in a pixel pattern forming a display surface in the display device substrate (specifically, a repetitive pattern of thin film transistors, an opposed substrate, color filters, or the like of a liquid crystal display panel) is inspected.

What is claimed is:

1. A pattern defect inspection method for inspecting a defect which occured in a main pattern of an inspection object, said main pattern including a repetitive pattern in which unit patterns are periodically arranged, said method comprising:

forming, an auxiliary pattern for inspection simultaneously with forming said main pattern in a region of other than said main pattern, said auxiliary pattern including a repetitive pattern having a period different from that of said main pattern;

irradiating a light onto said auxiliary pattern at a predetermined incident angle, and receiving diffracted light generated by said auxiliary pattern by observation means to detect a defect of said auxiliary pattern, thereby determining the presence of a defect of said main pattern.

2. A pattern defect inspection method according to claim 1, wherein the period of said auxiliary pattern is smaller than that of said main pattern.

3. A pattern defect inspection method according to claim 2, wherein the period of said main pattern is 80 to 2000 μm and the period of said auxiliary pattern is 1 to 50 μm.

4. A pattern defect inspection method according to claim 2, wherein said auxiliary pattern is formed by periodically arranging unit patterns in both directions perpendicular to each other.

5. A pattern defect inspection method according to claim 2, wherein said inspection object is a photomask for manufacturing a display device substrate or a display device substrate.

6. A photomask manufacturing method, said photomask comprising a main pattern including a repetitive pattern in which unit patterns are periodically arranged, which method comprising:

a pattern forming step for forming an auxiliary pattern for inspection outside of said main pattern simultaneously with forming said main pattern, said auxiliary pattern including a repetitive pattern having a period different from that of said main pattern; and a defect inspection step, wherein said defect inspection step comprises irradiating a light onto said auxiliary pattern at a predetermined incident angle and receiving diffracted light generated by said auxiliary pattern by observation means to detect a defect of said auxiliary pattern, thereby determining the presence of a defect of said main pattern.

7. A photomask manufacturing method, said photomask having a main pattern including a repetitive pattern in which unit patterns are periodically arranged, which method comprising:

a pattern forming step for forming an auxiliary pattern for inspection outside of the main pattern simultaneously with forming said main pattern on a surface of a photomask blank in which a thin film and a resist film are formed on a transparent substrate, said auxiliary pattern including a repetitive pattern having a period different from that of said main pattern, a defect inspection step comprising irradiating a light onto said auxiliary pattern at a predetermined incident angle and receiving diffracted light generated by said auxiliary pattern by observation means to detect a defect of said auxiliary pattern; and an auxiliary pattern eliminating step for eliminating said auxiliary pattern.

8. A photomask manufacturing method according to claim 7, wherein:

said pattern forming step is performed by writing said auxiliary pattern simultaneously with said main pattern, and developing a resist pattern of said auxiliary pattern; and said defect inspection step is performed by irradiating a light onto said resist pattern of said auxiliary pattern and receiving diffracted light of reflected light generated by said auxiliary pattern by said observation means.

9. A photomask manufacturing method according to claim 8, wherein said auxiliary pattern eliminating step includes the step of removing said resist pattern of said auxiliary pattern.

10. A photomask manufacturing method according to claim 7, wherein said auxiliary pattern eliminating step includes the step of removing said thin film at a portion corresponding to said auxiliary pattern.

11. A photomask manufacturing method according to claim 8, wherein said auxiliary pattern eliminating step includes the step of removing said thin film at a portion corresponding to said auxiliary pattern.

12. A photomask manufacturing method according to claim 7, wherein:
said pattern forming step is performed by writing said auxiliary pattern simultaneously with said main pattern and forming, developing, and etching a thin film pattern of said auxiliary pattern; and
said defect inspection step is performed by irradiating a light onto said thin film pattern of said auxiliary pattern and receiving diffracted light of reflected light or transmitted light generated by said auxiliary pattern by said observation means.

13. A photomask manufacturing method according to claim 11, wherein said auxiliary pattern eliminating step includes the step of removing a pattern of said thin film at a portion corresponding to said auxiliary pattern.

14. A photomask manufacturing method according to claim 6, wherein the period of said auxiliary pattern is smaller than that of said main pattern.

15. A photomask manufacturing method according to claim 7, wherein the period of said auxiliary pattern is smaller than that of said main pattern.

16. A photomask manufacturing method according to claim 6, wherein the period of said main pattern is 80 to 2000 µm and the period of said auxiliary pattern is 1 to 50 µm.

17. A photomask manufacturing method according to claim 7, wherein the period of said main pattern is 80 to 2000 µm and the period of said auxiliary pattern is 1 to 50 µm.

18. A photomask manufacturing method according to claim 6, wherein said auxiliary pattern is formed by periodically arranging unit patterns in directions perpendicular to each other.

19. A photomask manufacturing method according to claim 7, wherein said auxiliary pattern is formed by periodically arranging unit patterns in directions perpendicular to each other.

20. A display device substrate manufacturing method comprising forming a pixel pattern using the photomask manufactured by the photomask manufacturing method according to claim 6, thereby manufacturing a display device substrate.

21. A display device substrate manufacturing method comprising forming a pixel pattern using the photomask manufactured by the photomask manufacturing method according to claim 7, thereby manufacturing a display device substrate.

* * * * *